(12) United States Patent
Kim et al.

(10) Patent No.: US 11,984,536 B2
(45) Date of Patent: May 14, 2024

(54) SEMICONDUCTOR LIGHT EMITTING DEVICE AND LIGHT EMITTING DEVICE PACKAGE HAVING THE SAME

(71) Applicant: SAMSUNG ELECTRONICS CO., LTD., Suwon-si (KR)

(72) Inventors: Taehun Kim, Bucheon-si (KR); Yongmin Kim, Hwaseong-si (KR); Sungwon Ko, Osan-si (KR); Bokyoung Kim, Hwaseong-si (KR); Jinhwan Kim, Seoul (KR); Wongoo Hur, Incheon (KR)

(73) Assignee: Samsung Electronics Co., Ltd. (KR)

( * ) Notice: Subject to any disclaimer, the term of this patent is extended or adjusted under 35 U.S.C. 154(b) by 389 days.

(21) Appl. No.: 17/308,345

(22) Filed: May 5, 2021

(65) Prior Publication Data
US 2022/0085245 A1 Mar. 17, 2022

(30) Foreign Application Priority Data
Sep. 15, 2020 (KR) .................. 10-2020-0118436

(51) Int. Cl.
*H01L 33/38* (2010.01)
*H01L 33/46* (2010.01)
(Continued)

(52) U.S. Cl.
CPC ............ *H01L 33/382* (2013.01); *H01L 33/46* (2013.01); *H01L 33/62* (2013.01); *H01L 33/32* (2013.01); *H01L 33/42* (2013.01)

(58) Field of Classification Search
CPC ....... H01L 33/382; H01L 33/46; H01L 33/62; H01L 33/32; H01L 33/42; H01L 33/20; H01L 33/36; H01L 33/48
See application file for complete search history.

(56) References Cited

U.S. PATENT DOCUMENTS 6,372,608 B1   4/2002   Shimoda et al.
6,645,830 B2   11/2003  Shimoda et al.
(Continued)

FOREIGN PATENT DOCUMENTS

KR   10-1111750 B1      2/2012
KR   10-2017-0143374 A  12/2017
(Continued)

*Primary Examiner* — Su C Kim
(74) *Attorney, Agent, or Firm* — Fish & Richardson P.C.

(57) ABSTRACT

A semiconductor light emitting device includes a first electrode layer, a light emitting structure on the first electrode layer, a transparent electrode layer between the first electrode layer and the light emitting structure, an interlayer insulating layer between the transparent electrode layer and the first electrode layer, and having first and second openings, a second electrode layer between the first electrode layer and the interlayer insulating layer, and connected to the transparent electrode layer, and an electrode pad contacting the second electrode layer, each of the first openings and at least one of the second openings define one group to have at least first and second groups, the first group being closer to the electrode pad than the second group is, and a distance between the first and second openings in the first group being greater than a distance between the first and second openings in the second group.

20 Claims, 12 Drawing Sheets

(51) Int. Cl.
*H01L 33/62* (2010.01)
*H01L 33/32* (2010.01)
*H01L 33/42* (2010.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,796,721 B2 | 8/2014 | Niki et al. |
| 9,006,775 B1* | 4/2015 | Kuo ............... H01L 33/382 257/98 |
| 9,461,210 B2 | 10/2016 | Takenaga et al. |
| 10,270,018 B2 | 4/2019 | Jang et al. |
| 10,490,702 B2 | 11/2019 | Park et al. |
| 2010/0171135 A1 | 7/2010 | Engl et al. |
| 2016/0111601 A1* | 4/2016 | Lee ............... H01L 33/387 257/98 |
| 2016/0307959 A1* | 10/2016 | Zhang ............ H01L 33/44 |
| 2017/0365745 A1 | 12/2017 | Yang et al. |
| 2018/0138372 A1 | 5/2018 | Kim et al. |
| 2018/0151545 A1 | 5/2018 | Huang et al. |
| 2019/0273181 A1* | 9/2019 | Lee ............... H01L 33/38 |

FOREIGN PATENT DOCUMENTS

| | | |
|---|---|---|
| KR | 10-2018-0055971 A | 5/2018 |
| WO | WO 2008/131735 A1 | 11/2008 |

* cited by examiner

SEMICONDUCTOR LIGHT EMITTING DEVICE AND LIGHT EMITTING DEVICE PACKAGE HAVING THE SAME

CROSS-REFERENCE TO RELATED APPLICATION

Korean Patent Application No. 10-2020-0118436, filed on Sep. 15, 2020, in the Korean Intellectual Property Office, and entitled: "Semiconductor Light Emitting Device and Light Emitting Device Package Having the Same," is incorporated by reference herein in its entirety.

BACKGROUND

1. Field

Embodiments relate to a semiconductor light emitting device and a light emitting device package having the same.

2. Description of the Related Art

A semiconductor light emitting device is known as a next-generation light source having advantages such as a long lifespan, low power consumption, fast response speeds, environmental friendliness, and the like, as compared to a conventional light source. In particular, since such a semiconductor light emitting device has an excellent luminous flux, it is attracting attention as a main light source of various products such as electric/electronic devices and lighting devices.

SUMMARY

According to an aspect of embodiments, a semiconductor light emitting device includes a first electrode layer having a first region and a second region, a light emitting structure disposed on the first electrode layer to overlap the first region, including a first conductivity-type semiconductor layer, an active layer, and a second conductivity-type semiconductor layer, and having a plurality of holes connected to the first conductivity-type semiconductor layer through the active layer, a transparent electrode layer disposed between the first electrode layer and the light emitting structure to overlap the first region, and contacting the second conductivity-type semiconductor layer, an interlayer insulating layer disposed between the transparent electrode layer and the first electrode layer, and having a plurality of first openings respectively connected to the plurality of holes and a plurality of second openings connected to the transparent electrode layer, a second electrode layer disposed between the first electrode layer and the interlayer insulating layer, connected to the transparent electrode layer through the plurality of second openings, disposed to be separated from the first electrode layer, and extended onto the second region of the first electrode layer, an electrode pad disposed on the second electrode layer to overlap the second region, and a plurality of contact electrodes passing through the second electrode layer, the interlayer insulating layer, and the transparent electrode layer, and connected to the first conductivity-type semiconductor layer through the plurality of holes, wherein each of the plurality of first openings and at least one second opening, adjacent to each of the plurality of first openings, among the plurality of second openings, form a group, wherein the group is provided as a plurality of groups including at least a first group and a second group, wherein the first group is disposed more adjacent to the electrode pad, as compared to the second group, and a width between a first opening and a second opening, forming the first group, is greater than a width between a first opening and a second opening, forming the second group.

According to another aspect of embodiments, a semiconductor light emitting device includes a first electrode layer having a first region and a second region; a light emitting structure disposed on the first electrode layer to overlap the first region, including a first conductivity-type semiconductor layer, an active layer, and a second conductivity-type semiconductor layer, and having a plurality of holes connected to the first conductivity-type semiconductor layer through the active layer, a transparent electrode layer disposed between the first electrode layer and the light emitting structure to overlap the first region, and contacting the second conductivity-type semiconductor layer, an interlayer insulating layer disposed between the transparent electrode layer and the first electrode layer, and having a plurality of first openings respectively connected to the plurality of holes and a plurality of second openings connected to the transparent electrode layer, a second electrode layer disposed between the first electrode layer and the interlayer insulating layer, connected to the transparent electrode layer through the plurality of second openings, disposed to be separated from the first electrode layer, and extended onto the second region of the first electrode layer, an electrode pad disposed on the second electrode layer to overlap the second region, and a plurality of contact electrodes passing through the second electrode layer, the interlayer insulating layer, and the transparent electrode layer, and connected to the first conductivity-type semiconductor layer through the plurality of holes, wherein each of the plurality of first openings and at least one second opening, adjacent to each of the plurality of first openings, among the plurality of second openings, form a group, wherein the group is provided as a plurality of groups including at least a first group and a second group, wherein the first group is disposed more adjacent to the electrode pad, as compared to the second group, and a width between a first opening and a second opening, forming the first group, is greater than a width between a first opening and a second opening, forming the second group, the number of second openings forming the second group is greater than the number of second openings forming the first group, or a width of the second opening forming the second group is greater than a width of the second opening forming the first group.

According to yet another aspect of embodiments, a light emitting device package includes a package substrate having a first lead frame and a second lead frame, and a semiconductor light emitting device having a first electrode layer contacting the first lead frame and having a first region and a second region, a light emitting structure disposed to overlap the first region of the first electrode layer, and an electrode pad electrically connected to the second lead frame, wherein the semiconductor light emitting device includes: the first electrode layer, the light emitting structure including a first conductivity-type semiconductor layer, an active layer, and a second conductivity-type semiconductor layer, and having a plurality of holes connected to the first conductivity-type semiconductor layer through the active layer, a transparent electrode layer disposed between the first electrode layer and the light emitting structure to overlap the first region, and contacting the second conductivity-type semiconductor layer, an interlayer insulating layer disposed between the transparent electrode layer and the first electrode layer, and having a plurality of first openings respectively connected to the plurality of holes and a plurality of second openings connected to the transparent electrode layer, a second electrode layer disposed between the first electrode layer and the interlayer insulating layer, connected to the transparent electrode layer through the plurality of second openings, disposed to be separated from the first electrode layer, and extended onto the second region of the first electrode layer, the electrode pad disposed on the second electrode layer to overlap the second region, and a plurality of contact electrodes passing through the second electrode layer, the interlayer insulating layer, and the transparent electrode layer, and connected to the first conductivity-type semiconductor layer through the plurality of holes, wherein each of the plurality of first openings and at least one second opening, adjacent to each of the plurality of first openings, among the plurality of second openings, form a group, wherein the group is provided as a plurality of groups including at least a first group and a second group, wherein the first group is disposed more adjacent to the electrode pad, as compared to the second group, and a width between a first opening and a second opening, forming the first group, is greater than a width between a first opening and a second opening, forming the second group.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
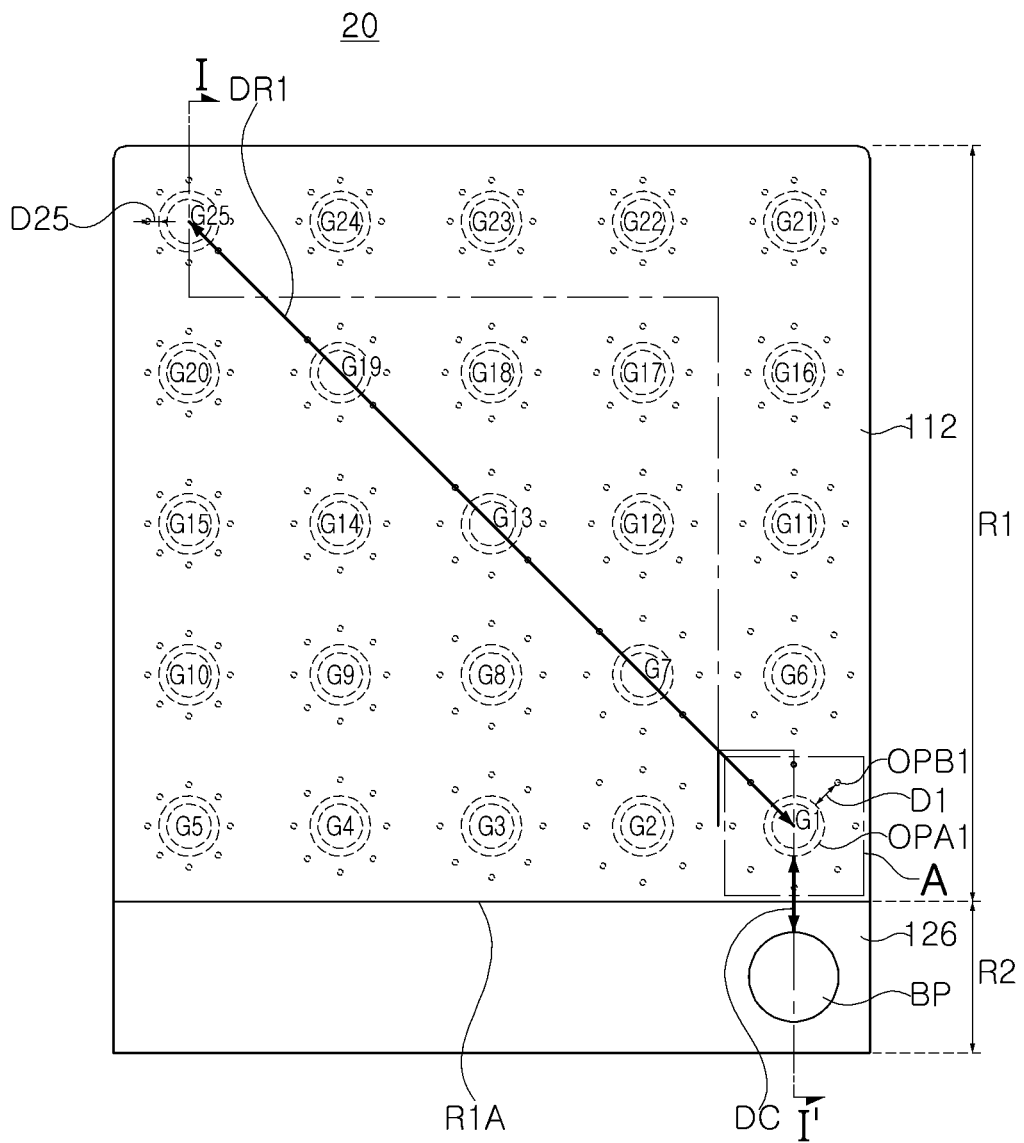
FIG. 1 is a plan view of a semiconductor light emitting device according to an embodiment.
Figure 2:
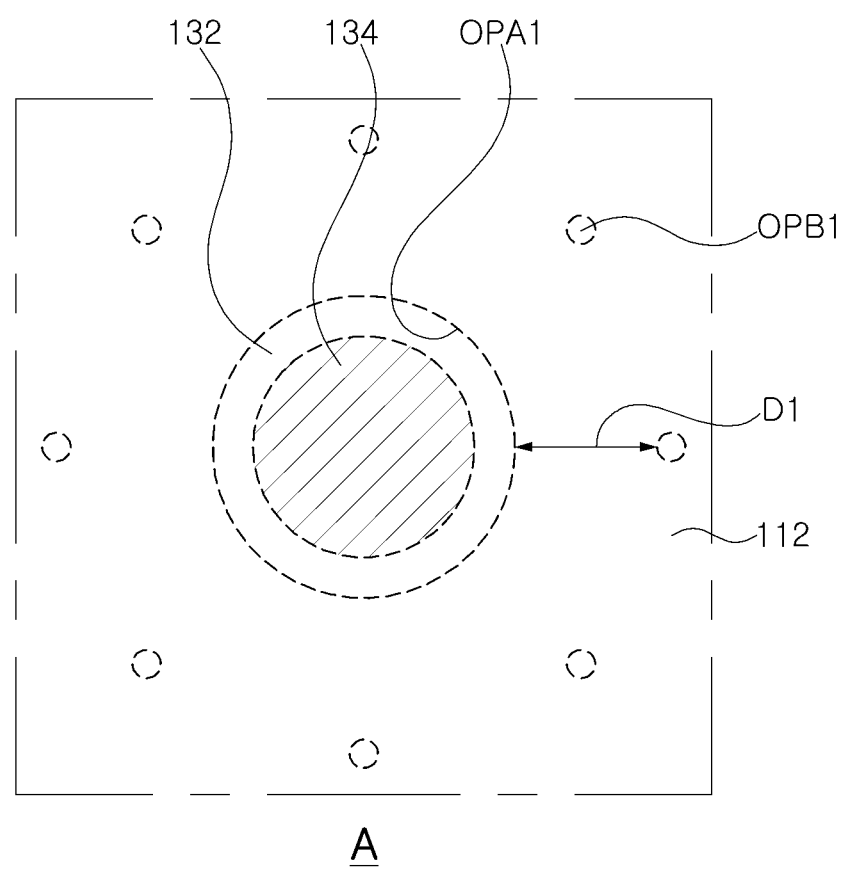
FIG. 2 is an enlarged view of portion A of FIG. 1.
Figure 3:
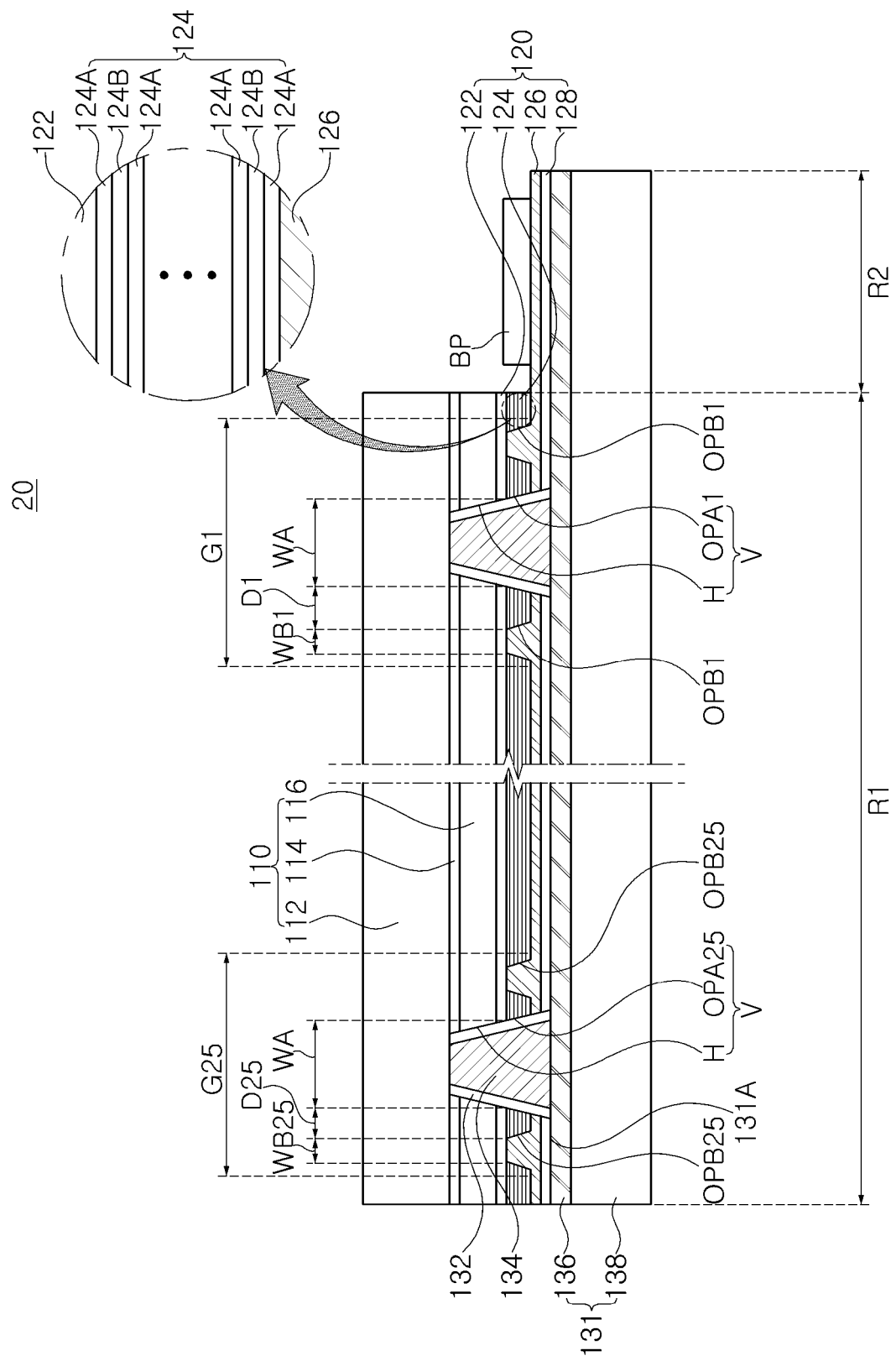
FIG. 3 is a side cross-sectional view of FIG. 1, taken along line I-I'.
Figure 4A:
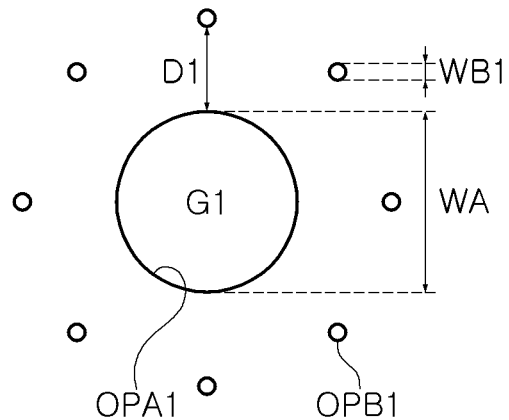
FIG. 4A is a view of openings of a first group in the interlayer insulating layer of FIG. 1.
Figure 4B:
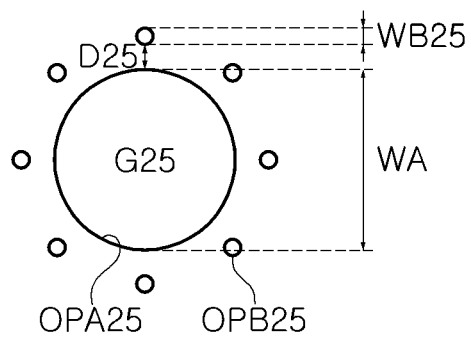
FIG. 4B is a view of openings of a twenty-fifth group in the interlayer insulating layer of FIG. 1.

A semiconductor light emitting device according to an embodiment will be described with reference to FIGS. 1 to 3. FIG. 1 is a plan view of a semiconductor light emitting device according to an embodiment, FIG. 2 is an enlarged view of portion A of FIG. 1, and FIG. 3 is a side cross-sectional view along line I-I' of FIG. 1. FIGS. 4A and 4B are enlarged top views of a first group and a twenty fifth group, respectively, corresponding to FIG. 2.

Referring to FIGS. 1 and 3, a semiconductor light emitting device 20 according to an embodiment may include a first electrode layer 131, a light emitting structure 110, a transparent electrode layer 122, an interlayer insulating layer 124, a second electrode layer 126, and an electrode pad BP.

The first electrode layer 131 may have an upper surface 131A having first and second regions R1 and R2. The first region R1 may be provided as a region from which light is emitted, and the second region R2 may be provided as a region on which the electrode pad BP is disposed. In this embodiment, the second region R2 may be elongated onto and disposed on one side R1A of the first region R1, e.g., the second region R2 may be at a periphery of the first region R1 and attached to the first region R1 via the one side R1A.

The first electrode layer 131 may include a conductive substrate 138 and a bonding metal layer 136. The first electrode layer 131 may support the light emitting structure 110, and may be used as an electrode to which power is applied, due to conductivity. For example, the conductive substrate 138 may be one of silicon, strained Si, a silicon alloy, a silicon-on-insulator (SOI), silicon carbide (SiC), silicon germanium (SiGe), silicon germanium carbide (SiGeC), germanium, a germanium alloy, gallium arsenide (GaAs), indium arsenide (InAs), a III-V semiconductor, or a II-VI semiconductor. The bonding metal layer 136 may be a bonding metal, e.g., Au, Sn, Ni, Au—Sn, Ni—Sn, or Ni—Au—Sn. Therefore, power may be applied to a first conductivity-type semiconductor layer 112 through the first electrode layer 131. In this embodiment, power may be applied to the first conductivity-type semiconductor layer 112 through the first electrode layer 131 and a contact electrode 134.

Referring to FIG. 3, the light emitting structure 110 may be disposed on the first region R1 of the first electrode layer 131. The light emitting structure 110 may include a first conductivity-type semiconductor layer 112, an active layer 114, and a second conductivity-type semiconductor layer 116. In an embodiment, the light emitting structure 110 may be a structure in which the second conductivity-type semiconductor layer 116, the active layer 114, and the first conductivity-type semiconductor layer 112 are stacked on the first electrode layer 131 in sequence.

For example, the first conductivity-type semiconductor layer 112 may include a nitride semiconductor satisfying n-type $In_xAl_yGa_{1-x-y}N$ ($0 \leq x < 1$, $0 \leq y < 1$, $0 \leq x+y < 1$), where the n-type impurity may be Si. For example, the first conductivity-type semiconductor layer 112 may include an n-type GaN layer. The second conductivity-type semiconductor layer 116 may be a nitride semiconductor layer satisfying p-type $In_xAl_yGa_{1-x-y}N$ ($0 \leq x < 1$, $0 \leq y < 1$, $0 \leq x+y < 1$), where the p-type impurity may be Mg. In some embodiments, the second conductivity-type semiconductor layer 116 may be implemented as a single-layer structure, but in other embodiments, a multilayer structure having different compositions may be provided. The active layer 114 may have a multiple quantum well (MQW) structure in which a quantum well layer and a quantum barrier layer are alternately stacked with each other. For example, the quantum well layer and the quantum barrier layer may be $In_xAl_yGa_{1-x-y}N$ ($0 \leq x \leq 1$, $0 \leq y \leq 1$, $0 \leq x+y \leq 1$) having different compositions. In a specific example, the quantum well layer may be $In_xGa_{1-x}N$ ($0 < x \leq 1$), and the quantum barrier layer may be GaN or AlGaN.

In this embodiment, the light emitting structure 110 may have a plurality of holes H connected to the first conductivity-type semiconductor layer 112 through the second conductivity-type semiconductor layer 116 and the active layer 114. The plurality of holes H may be respectively connected to a plurality of first openings OPA1 and OPA25 of the interlayer insulating layer 124 to be described later, to form a plurality of via holes V connecting the first conductivity-type semiconductor layer 112 and the first electrode layer 131. The plurality of holes H may be periodically disposed to have substantially the same distance on a surface of the light emitting structure 110. However, embodiments are not limited thereto, and according to embodiments, the plurality of holes H may be arranged non-periodically.

The interlayer insulating layer 124 may be disposed between the first electrode layer 131 and the light emitting structure 110. The interlayer insulating layer 124 may be disposed to overlap the first region R1 of the first electrode layer 131, e.g., the interlayer insulating layer 124 may be only in the first region R1 without overlapping the second region R2. The interlayer insulating layer 124 may be a reflector reflecting light directed to the transparent electrode layer 122, among light emitted from the active layer 114, in a direction facing the first conductivity-type semiconductor layer 112. A plurality of first openings OPA1 and OPA25 and a plurality of second openings OPB1 and OPB25 may be formed in the interlayer insulating layer 124 to pass through, e.g., an entire thickness of, the interlayer insulating layer 124 in a thickness direction, e.g., each of the plurality of first openings OPA1 and OPA25 may be surrounded by a plurality of respective second openings OPB1 and OPB2 (FIG. 2). The plurality of first openings OPA1 and OPA25 and the plurality of second openings OPB1 and OPB25 will be described in detail later.

The interlayer insulating layer 124 may be made of a material having insulating properties and light transmission properties. The interlayer insulating layer 124 may include silicon oxide or silicon nitride, and may be formed of, e.g., $SiO_2$, SiN, $SiO_xN_y$, $TiO_2$, $Si_3N_4$, $Al_2O_3$, TiN, AlN, $ZrO_2$, TiAlN, TiSiN, or the like.

The interlayer insulating layer 124 may have a multilayer or a single layer structure. For example, the interlayer insulating layer 124 may have a multilayer structure in which a first insulating layer 124A and a second insulating layer 124B, having first and second refractive indices, which may be different from each other, may be alternately stacked. Through this stacked structure, the interlayer insulating layer 124 may form a distributed Bragg reflector (DBR). In another example, the interlayer insulating layer 124 may have a single layer structure, and the interlayer insulating layer 124 and the second electrode layer 126 contacting the interlayer insulating layer 124 may form an omnidirectional reflector (ODR).

The second electrode layer 126 may be disposed between the first electrode layer 131 and the interlayer insulating layer 124 to contact the interlayer insulating layer 124, and may extend to the second region R2. The electrode pad BP may be disposed in a portion of the second electrode layer 126 extending to the second region R2. The second electrode layer 126 may be disposed to fill the second openings OPB1 and OPB25 of the interlayer insulating layer 124. Therefore, the second electrode layer 126 may be connected to the transparent electrode layer 122 through the second openings OPB1 and OPB25 of the interlayer insulating layer 124. Further, the second electrode layer 126 may be formed by extending the first openings OPA1 and OPA25 of the interlayer insulating layer 124. The second electrode layer 126 may be formed of a conductive material having ohmic characteristics with the transparent electrode layer 122, to have a single layer or multilayer structure. For example, the second electrode layer 126 may be formed of a material including at least one of a highly reflective material, e.g., Au, W, Pt, Si, Ir, Ag, Cu, Ni, Ti, Cr, or the like, or alloys thereof. An insulating separation layer 128 may be interposed between the first electrode layer 131 and the second electrode layer 126 for electrical insulation thereof. The insulating separation layer 128 may include, e.g., a silicon oxide film.

The contact electrode 134 may be disposed to electrically connect the first electrode layer 131 and the first conductivity-type semiconductor layer 112 as a via electrode. The contact electrode 134 may pass through the insulating separation layer 128, the second electrode layer 126, the interlayer insulating layer 124, the transparent electrode layer 122, the second conductivity-type semiconductor layer 116, and the active layer 114, to electrically connect the first electrode layer 131 and the first conductivity-type semiconductor layer 112. The contact electrode 134 may be disposed in the via hole V formed by extending the plurality of holes H of the light emitting structure 110 and the first openings OPA1 and OPA25 of the interlayer insulating layer 124. Therefore, the contact electrode 134 may be disposed in a number corresponding to each of the first openings OPA1 and OPA25, e.g., one contact electrode 134 may be positioned in each of the first openings OPA1 and OPA25. For example, as illustrated in FIG. 1, when viewed from an upper surface of the semiconductor light emitting device 20, twenty five (25) contact electrodes 134 may be disposed, but the number of contact electrodes 134 is not limited thereto, and may be variously modified in two or more ranges. The contact electrode 134 may include a metallic material, e.g., Cu, Al, or W.

An insulating spacer 132 may be disposed around the contact electrode 134, e.g., the insulating spacer 132 may cover the entire sidewall of the contact electrode 134 to surround an entire perimeter of the contact electrode 134. The insulating spacer 132 may include, e.g., a silicon oxide film or a silicon nitride film.

The transparent electrode layer 122 may be disposed, e.g., directly, between the interlayer insulating layer 124 and the light emitting structure 110. The transparent electrode layer 122 may be disposed to overlap the first region R1 of the first electrode layer 131, e.g., the transparent electrode layer 122 may not be in the second region R2, and may be disposed to, e.g., directly, contact the second conductivity-type semiconductor layer 116 of the light emitting structure 110. The transparent electrode layer 122 may diffuse current injected from the second electrode layer 126 to reduce concentration of injected current in one region of the second conductivity-type semiconductor layer 116. For example, the transparent electrode layer 122 may be disposed to entirely cover the second conductivity-type semiconductor layer 116. In another example, the transparent electrode layer 122 may be disposed to contact only a partial region of the second conductivity-type semiconductor layer 116.

The transparent electrode layer 122 may be formed of a transparent conductive oxide (TCO) material, e.g., indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_2$ or $Zn_{(1-x)}Mg_xO$ (zinc magnesium oxide, $0 \leq x \leq 1$), or the like, and/or a light-transmitting polymer resin including at least one of an Ag nanowire or a carbon nanotube (CNT) to have conductivity.

The transparent electrode layer 122 may be formed by extending the first openings OPA1 and OPA25 of the interlayer insulating layer 124. Therefore, the contact electrode 134 may electrically contact the first conductivity-type semiconductor layer 112 of the light emitting structure 110 while being insulated from the transparent electrode layer 122.

The electrode pad BP may be disposed in a region of the second electrode layer 126 that overlaps the second region R2. The electrode pad BP may be a region to which a wire for applying power is bonded. A current supplied through the wire may be injected into the transparent electrode layer 122 through the second electrode layer 126, e.g., through portions of the second electrode layer 126 contacting the transparent electrode layer 122 via the second openings OPB1 and OPB25 in the interlayer insulating layer 124. In this embodiment, although one (1) electrode pad BP is disposed, according to an embodiment, the electrode pad BP may be provided as a plurality of electrode pads BP, and the plurality of electrode pads BP may be arranged in the second region R2.

A current applied through the electrode pad BP may be injected from the second electrode layer 126 into the transparent electrode layer 122 through the second openings OPB1 and OPB25. The current injected into the transparent electrode layer 122 may flow to the contact electrode 134 and the first electrode layer 131 via the second conductivity-type semiconductor layer 116, the active layer 114, and the first conductivity-type semiconductor layer 112.

The current applied from an electrode pad tends to be concentrated on and flowed in an opening closest to the electrode pad, in order to flow through a route with the smallest electrical resistance. For example, referring to FIG. 1, if all first and second openings were to be formed identically to each other with identical distances therebetween, a current applied from the electrode pad BP would have concentrated on and flowed in the second opening OPB1 included in the first group G1 at a distance DC closest to the electrode pad BP. In this manner, light emitted from the active layer would have also concentrated only in a region adjacent to the electrode pad BP, thereby reducing the light extraction efficiency.

In contrast, according to embodiments, all portions of the second conductivity-type semiconductor layer 116 with respect to the electrode pad BP may have substantially the same electrical resistance, thereby substantially alleviating current concentration only on a region adjacent to the electrode pad BP. In other words, according to embodiment, respective distances D1 and D25 between each of the first openings OPA1 and OPA25 and each of the second openings OPB1 and OPB25, respective widths WB1 and WB25 of the second openings OPB1 and OPB25, or the number of each of the second openings OPB1 and OPB25 adjacent to a peripheral region of each of the first openings OPA1 and OPA25 may be adjusted to increase electrical resistance uniformity of all portions of the second conductivity-type semiconductor layer 116 with respect to the electrode pad BP, thereby alleviating the current concentration in a single region.

In FIGS. 1 to 4B, the embodiment relates to a case of adjusting the respective distances D1 and D25 between each of the first opening OPA1 and the OPA25 and each of the second openings OPB1 and OPB25. For example, as illustrated in FIG. 3, the distance D1 refers to a maximal distance between facing sidewalls of the first opening OPA1 and an adjacent second opening OPB1, and the distance D25 refers to a maximal distance between facing sidewalls of the first opening OPA25 and an adjacent second opening OPB25.

Referring to FIGS. 1 and 3, the respective distances D1 and D25 between each of the first openings OPA1 and OPA25 and each of the second openings OPB1 and OPB25 included in respective groups may be configured to gradually decrease as proceeding from a first group G1 disposed closest to the electrode pad BP to a 25th group G25 disposed farthest from the electrode pad BP along a first direction DR1 connecting a first group G1 and the 25th group G25. For example, referring to FIG. 1, the distance D1 between the first opening OPA1 and an adjacent second opening OPB1 in the first group G1 may be larger than the distance D25 between the first openings OPA25 and an adjacent second opening OPB25 in the 25th group G25. For example, distances between a first opening and an adjacent second opening, included in the first group G1, a 7th group G7, a 13th group G13, a 19th group G19, and a 25th group G25 (arranged in the first direction DR1) may be configured to gradually decrease from the first group G1 to the 25th group G25. The distance between the first opening and the second opening may decrease linearly in the first direction DR1, but is not limited thereto, and may be variously modified within decreasing ranges.

In detail, referring to FIGS. 4A and 4B, it can be seen that a width WA of the first opening OPA1, e.g., a diameter of the first opening OPA1, and a width WB1 of the second opening OPB1, e.g., a diameter of the second opening OPB1, included in the first group G1 is identical to a width WA of the first opening OPA25 and a width WB25 of the second opening OPB25 included in the 25th group G25, respectively. However, the distance D25 between the first opening OPA25 and the second opening OPB25 included in the 25th group G25 is less than the distance D1 between the first opening OPA1 and the second opening OPB1 included in the first group G1.

As described above, when the distance between the first opening and the second opening decreases in a group farther from the electrode pad BP, it may prevent or substantially minimize current diffused through the transparent electrode layer 122 to second conductivity-type semiconductor layer 116 from concentrating on a group most adjacent to the electrode pad BP, e.g., group G1.

A degree of concentration of the current diffused through the transparent electrode layer 122 may vary depending on a distance from the electrode pad BP to which the current is injected. For example, the current may concentrate on a region adjacent to the electrode pad BP, and the degree of concentration of the current may be relatively low in a region far therefrom. This phenomenon may entirely reduce spread of current applied to a semiconductor light emitting device, to generate an electrical-over-stress (EOS) in the region adjacent to the electrode pad. Such an electrical-over-stress may serve as a cause of lowering reliability of the semiconductor light emitting device and lowering light extraction efficiency.

Table 1 below shows a chart measuring maximum current density values of an Example in which distances between first and second openings gradually decreases according to groups, and maximum current density values of a Comparative Example in which distances between first and second openings are uniformly maintained.

TABLE 1

| Driving Current | 350 mA | 1000 mA |
| --- | --- | --- |
| Maximum Current Density Values of Example | 106.005 A/cm$^2$ | 369.52 A/cm$^2$ |
| Maximum Current Density Values of Comparative Example | 110.321 A/cm$^2$ | 387.687 A/cm$^2$ |

As seen in Table 1, when a driving current of 350 mA was respectively applied to the semiconductor light emitting devices of the Example and the Comparative Example, maximum current density values were measured to be 106.005 A/cm$^2$ and 110.321 A/cm$^2$, respectively. In addition, when a driving current of 1000 mA was respectively applied to each of the semiconductor light emitting devices of the Example and the Comparative Example, maximum current density values were measured to be 369.52 A/cm$^2$ and 387.687 A/cm$^2$, respectively. In this case, peak current density values of the Example were measured to be about 3.9% and about 4.7% lower than peak current density values of the Comparative Example, respectively. From this, it can be seen that concentration of a current in the Example is reduced to lower a maximum current density value, as compared to the Comparative Example.

Figure 5:
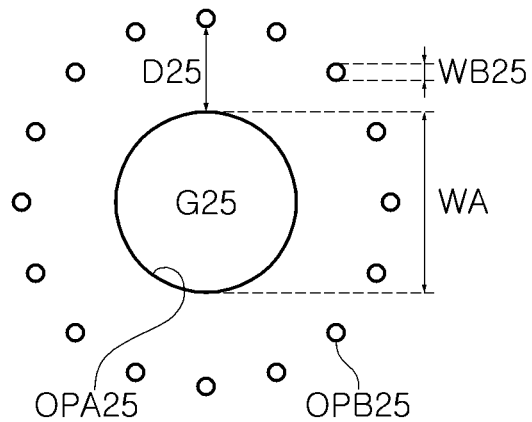
FIGS. 5 to 7 are various modified embodiments of FIG. 4B.
Figure 6:
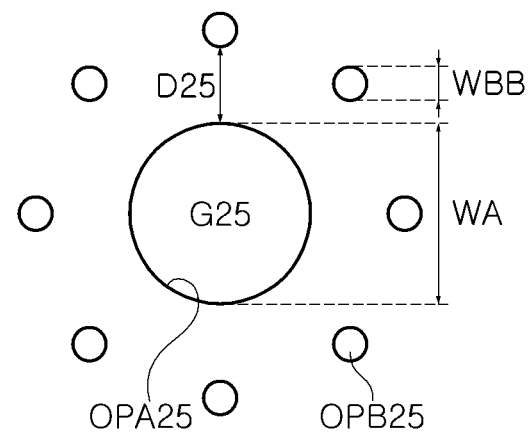
Figure 7:
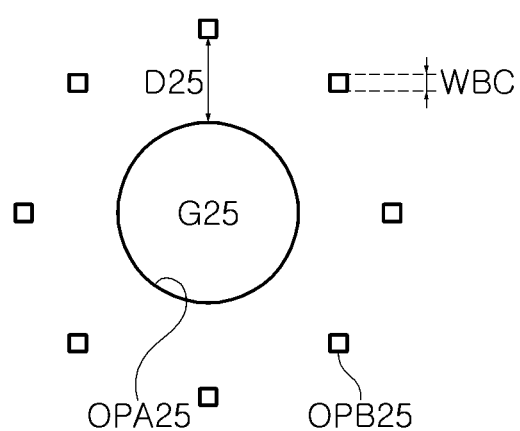

FIGS. 5 to 7 are various modified embodiments of the second opening OPB25 of the 25th group G25 disposed farthest from the electrode pad BP. Although only the 25th group G25 is illustrated in FIGS. 5 to 7, as described above, other groups may similarly adjust distances between a first opening and a second opening according to distances to the electrode pad BP.

FIG. 5 illustrate a case in which the number of second openings OPB25 included in the 25th group G25 is greater than the number of second openings OPB1 included in the first group G1, illustrated in FIG. 4A.

FIG. 6 illustrate a case in which a width WBB of the second opening OPB25 included in the 25th group G25 is greater than a width WB1 of the second opening OPB1 included in the first group G1, illustrated in FIG. 4A.

FIG. 7 illustrate a case in which a width WBC of the second opening OPB25 included in the 25th group G25 is identical to a width WB1 of the second opening OPB1 included in the first group G1, illustrated in FIG. 4A. However, the second opening OPB25 included in the 25th group G25 are formed to have a rectangular shape to have a broader area, as compared to a circular shape of the second opening OPB1 included in the first group G1, illustrated in FIG. 4A.

Such a change in distance between the first and second openings may be made not only among groups in the first direction DR1, but also in a direction facing groups adjacent to respective sides of the semiconductor light emitting device 20. For example, referring to FIG. 1, a distance between a first opening and a second opening may gradually decrease, in directions respectively facing from the first group G1 closest to the electrode pad BP, to a 5th group, a 10th group, a 15th group, and a 20th group to a 24th group G5, G10, G15, and G20 to G24, disposed adjacent to respective sides of a semiconductor light emitting device.

FIGS. 8 to 12 illustrate cases in which groups have a same arrangement, e.g., a same distance between the first and second openings, within a same unit region, while a distance between the first and second openings gradually changes from a unit region closest to the electrode pad BP to a unit region farthest from the electrode pad BP.

Figure 8:
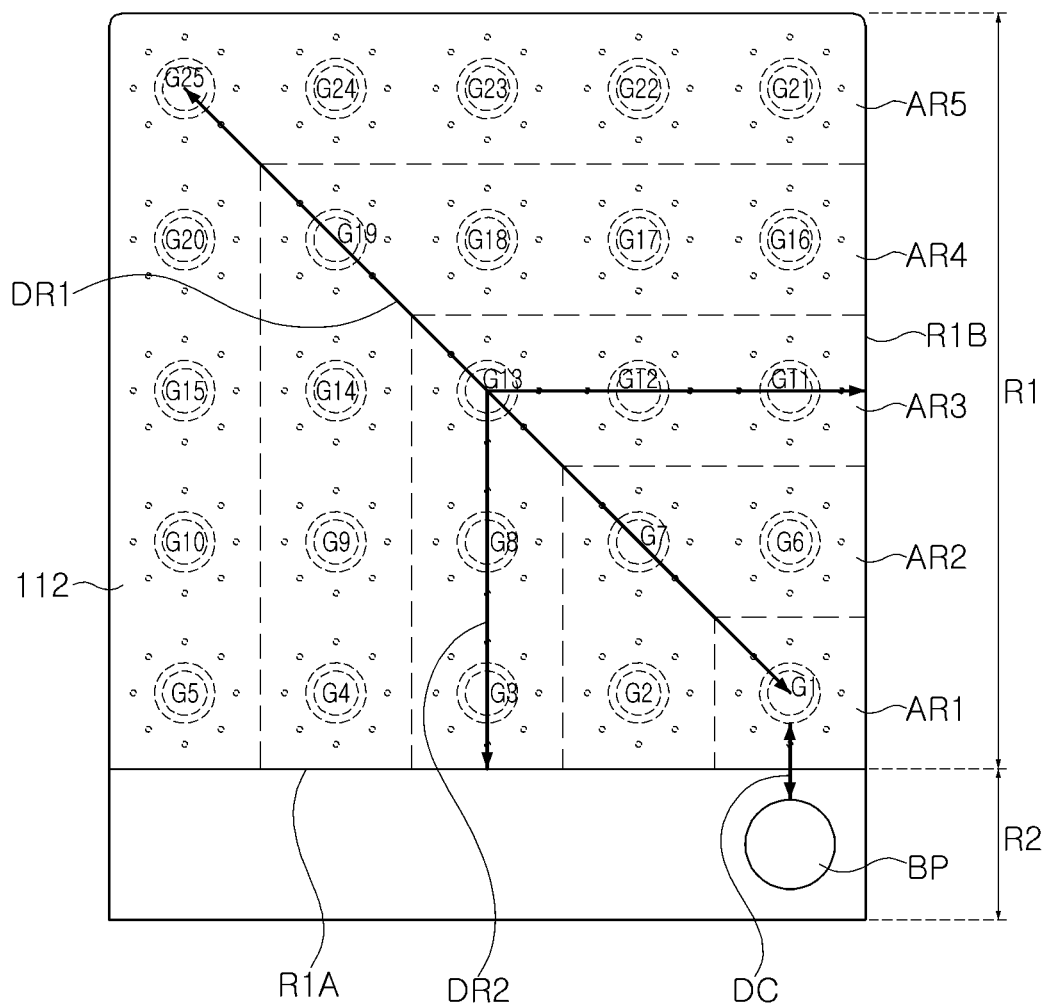
FIG. 8 is a view of an arrangement of groups.
Figure 9:
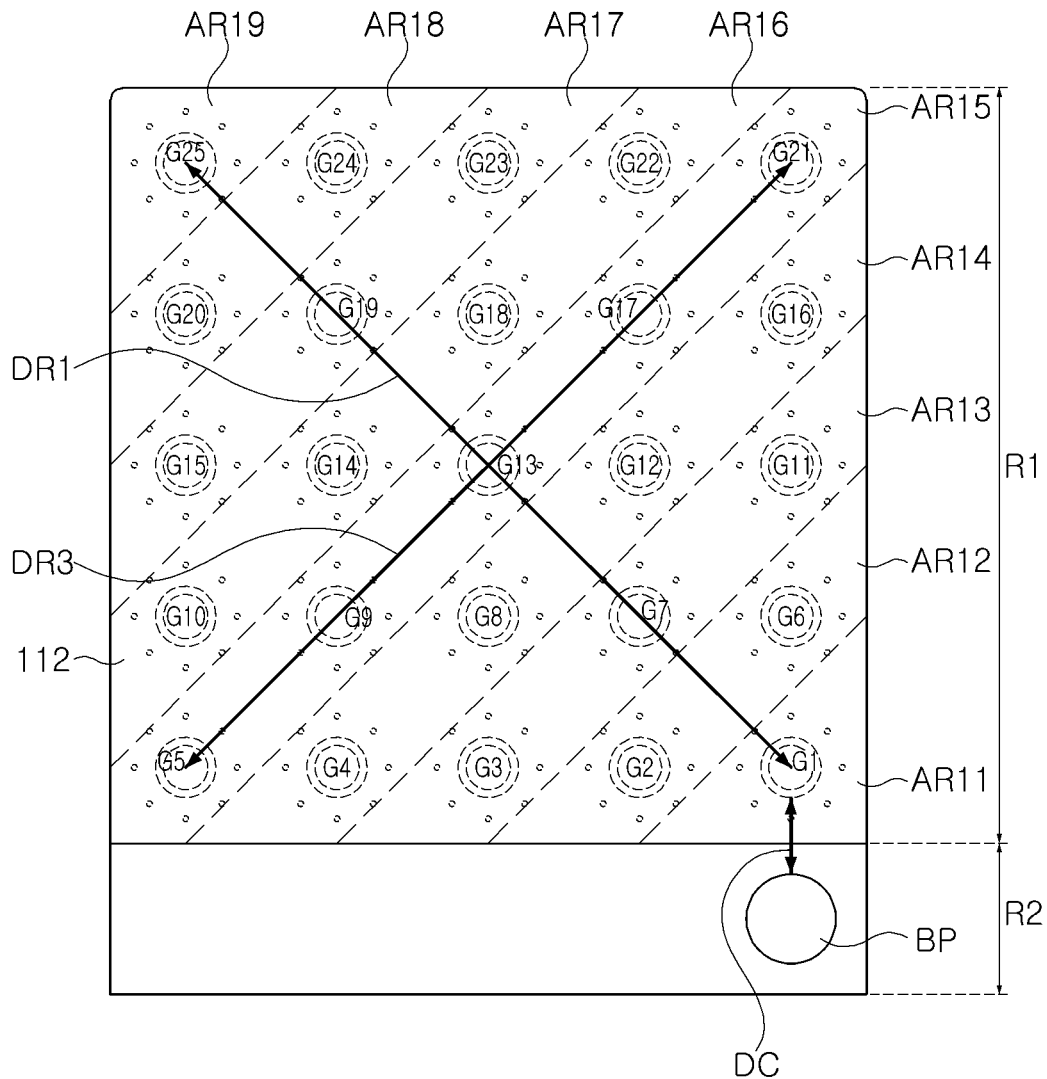
FIGS. 9 to 12 are other embodiments of FIG. 8.

FIGS. 8 and 9 illustrate a case in which one (1) electrode pad BP is disposed in the second region R2 of semiconductor light emitting devices 20A and 20B, respectively. In particular, the electrode pad BP in FIGS. 8 and 9 is disposed on one side R1A of the first region R1, e.g., at a corner.

Referring to FIG. 8, a gradual change, e.g., decrease, in distance between the first and second openings may be made in the first direction DR1 from the first group G1 (i.e., closest to the electrode pad BP) to the 25th group G25 (i.e., farthest from the electrode pad BP) via unit regions. In detail, unit regions AR1 to AR5 may be disposed, e.g., defined, to extend in a second direction DR2 from respective groups G1, G7, G13, G19, and G25 (arranged in the first direction DR1) toward one of the sides R1A or R1B of the semiconductor light emitting device 20A.

In the above-described embodiments, unit regions may be arranged on a straight line connecting a group closest to an electrode pad and a group farthest to the electrode pad. For example, a distance between the first and second openings within a same unit region may be the same, e.g., a distance between the first and second openings in groups G2, G6, and G7 (within unit region AR2 in FIG. 8) may be the same, while a distance between the first and second openings between adjacent unit regions may be different, e.g., a distance between the first and second openings in the unit region AR2 may be smaller than in the unit region AR1.

Referring to FIG. 9, a gradual change, e.g., decrease, in distance between the first and second openings may be made in the first direction DR1 from the first group G1 (i.e., closest to the electrode pad BP) to the 25th group G25 (i.e., farthest from the electrode pad BP) via unit regions. In detail, similarly to the arrangement described previously with reference to FIG. 8, a gradual change in distance between the first and second openings among the unit regions AR11 to AR19 disposed, e.g., defined, to extend in a third direction DR3, perpendicular to the first direction DR1, may be made, e.g., a distance between the first and second openings in the unit region AR12 may be smaller than in the unit region AR11.

Figure 10A:
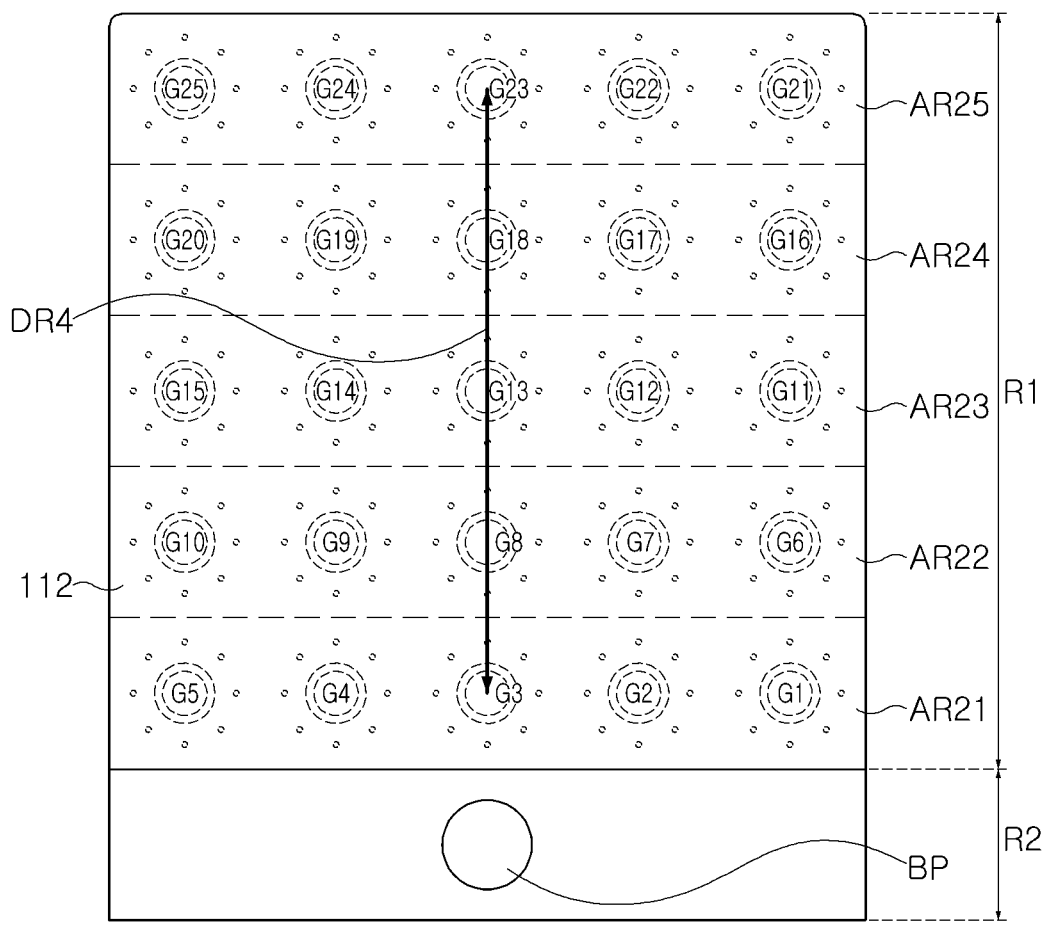

FIG. 10A illustrates a case in which one (1) electrode pad BP is disposed in the second region R2 of a semiconductor light emitting device 20C, similar to the above-described embodiments, with the exception of the electrode pad BP being provided in a central portion of the second region R2 (rather than in a corner portion). In this case, unit regions AR21 to AR25 may be arranged, e.g., defined, in a fourth direction DR4, parallel to the second region R2. In an embodiment, a 21st group G21 and a 25th group G25 in the unit region AR25 are disposed farthest from the electrode pad BP, and may be symmetrically disposed with respect to a third group G3 (in the unit region AR21) closest to the electrode pad BP. Therefore, the fourth direction DR4 may be disposed between the 21st group G21 and the 25th group G25. For example, a gradual change in distance between the first and second openings may occur from the unit region AR21 to the unit region AR25.

Figure 10B:
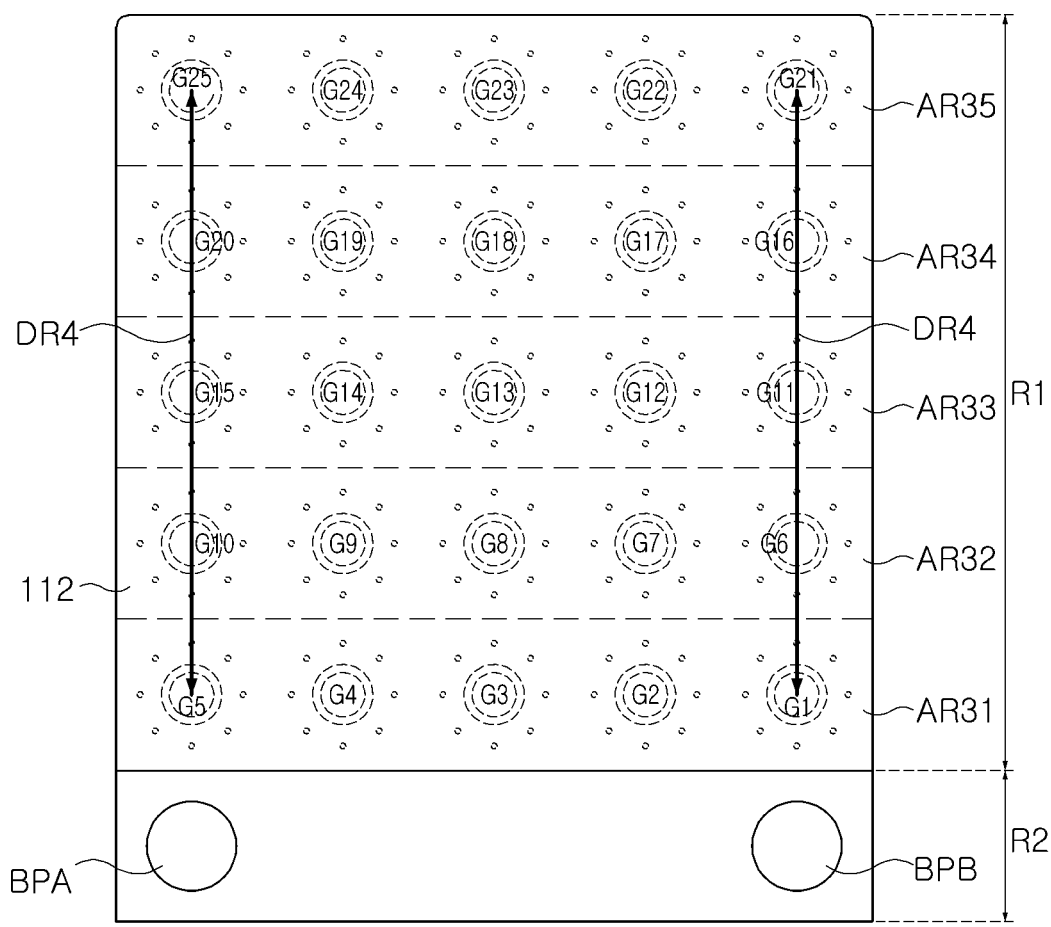

FIG. 10B illustrates a case in which first and second electrode pads BPA and BPB are disposed in the second region R2 of a semiconductor light emitting device 20D, e.g., at opposite corners. Similarly to a case in which one electrode pad is disposed in a central portion of the second region R2, unit regions AR31 to AR35 may be arranged, e.g., defined, in the fourth direction DR4, parallel to the second region R2.

Figure 11:
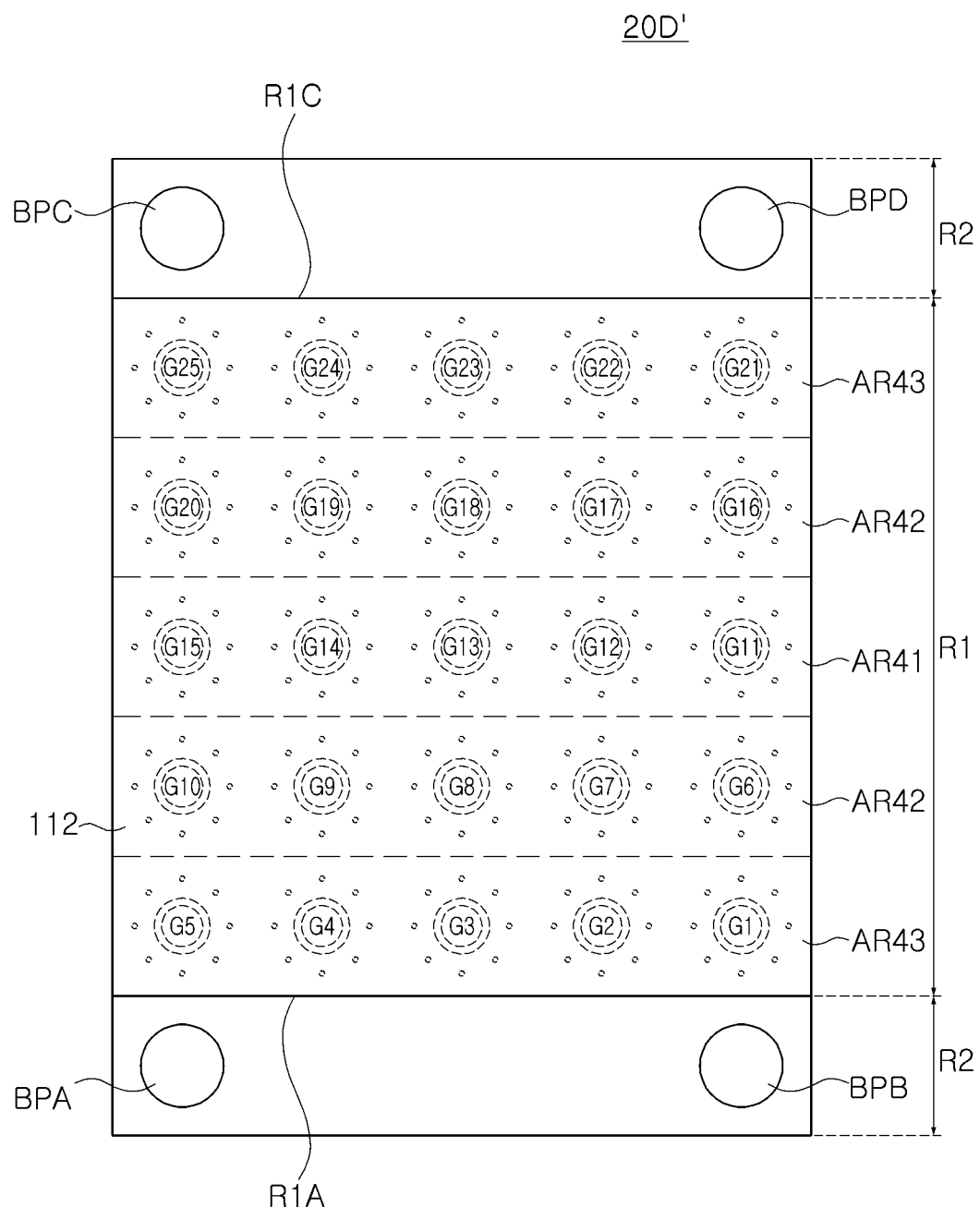

FIG. 11 illustrates a case in which second regions R2 are disposed on opposite sides R1A and R1C of a semiconductor light emitting device 20D', respectively. Unit regions AR41 to AR43 may be arranged in a similar manner to FIG. 10B described above, but may be arranged to gradually change, e.g., distance between the first and second openings, from the 43rd unit regions AR43 respectively adjacent to the second regions R2 toward the 41st unit region AR41 disposed in a central portion of the first region R1.

Figure 12:
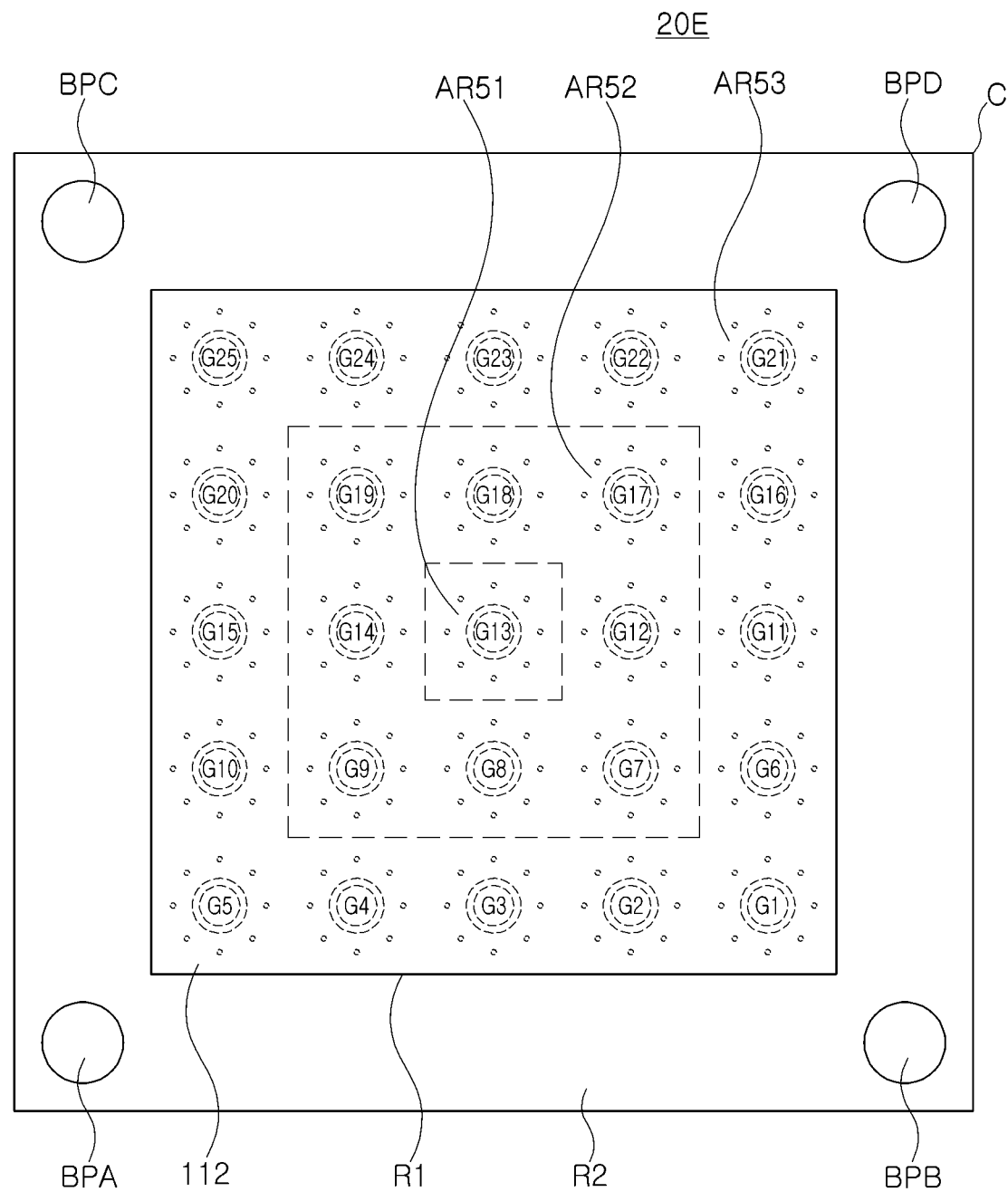

FIG. 12 illustrates a case in which the second region R2, e.g., continuously, surrounds, e.g., an entire, perimeter of a semiconductor light emitting device 20E, and first to fourth electrode pads BPA, BPB, BPC, and BPD may be disposed to be respectively adjacent to corners C of the semiconductor light emitting device 20E. Unit regions AR51 to AR53 may be arranged to gradually change, e.g., distance between the first and second openings, toward a 13th group G13 disposed farthest in common with the first to fourth electrode pads BPA, BPB, BPC, and BPD, respectively, e.g., the 13th group G13 may be disposed in a center of the semiconductor light emitting device 20E (top view).

Figure 13:
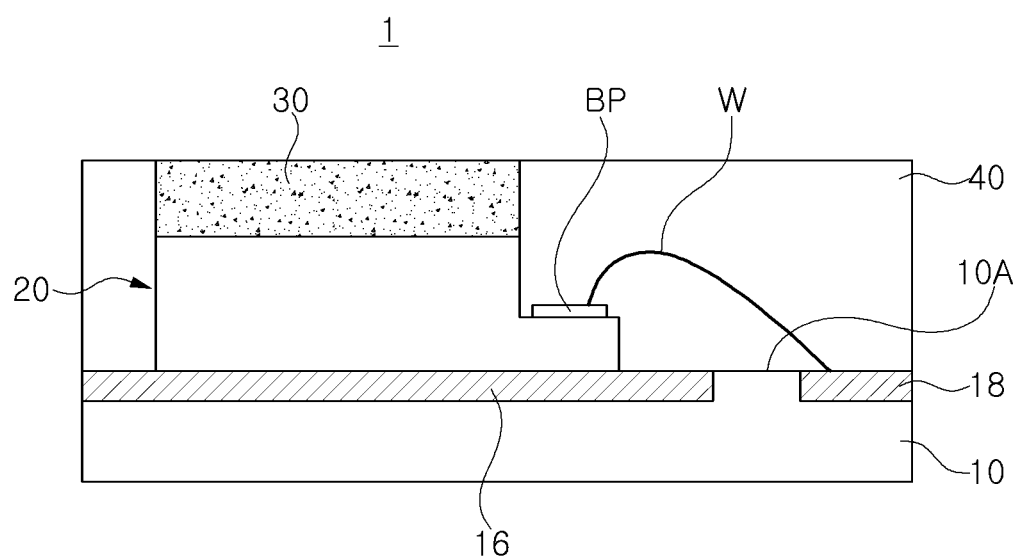
FIG. 13 is a cross-sectional view of a light emitting device package incorporating a semiconductor light emitting device according to an embodiment.

FIG. 13 is a side cross-sectional view illustrating a light emitting device package employing the semiconductor light emitting device of FIG. 3.

Referring to FIG. 13, a light emitting device package 1 may include a package substrate 10 having first and second lead frames 16 and 18, and the semiconductor light emitting device 20 disposed on the package substrate 10. The semiconductor light emitting device 20 is the semiconductor light emitting device illustrated in FIG. 3.

The package substrate 10 may include the first and second lead frames 16 and 18, and the first and second lead frames 16 and 18 may be configured to be located on an upper surface 10A of the package substrate 10, respectively. The semiconductor light emitting device 20 may be electrically connected to the first lead frame 16. The electrode pad BP of the semiconductor light emitting device 20 may be electrically connected to the second lead frame 18 using a wire W.

A wavelength conversion layer 30 may be disposed on the semiconductor light emitting device 20. The wavelength conversion layer 30 may include a wavelength conversion material, e.g., a phosphor or quantum dot, that converts a wavelength of light generated by the semiconductor light emitting device 20.

In addition, the light emitting device package 1 may further include a reflective resin layer 40 disposed on the package substrate 10 and surrounding the semiconductor light emitting device 20. The reflective resin layer 40 may include a molding member including light reflective powders, e.g., $TiO_2$, $Al_2O_3$, or the like.

By way of summation and review, in order to maintain reliability of a semiconductor light emitting device, interest in improving heat dissipation performance by improving current distribution has been increasing. Therefore, embodiments provide a semiconductor light emitting device having improved light efficiency and a light emitting device package having the same.

According to embodiments, a semiconductor light emitting device and a light emitting device package may reduce current concentration to have improved light efficiency. That is, according to embodiments, a semiconductor light emitting device may have an adjusted distance between openings of a reflective structure formed to inject a current in order to increase uniformity of electrical resistance in all regions of a light emitting structure, thereby preventing or substantially minimizing concentration of current in an opening closest to an electrode pad.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
a first electrode layer having a first region and a second region;
a light emitting structure on the first region of the first electrode layer, the light emitting structure including:
a first conductivity-type semiconductor layer,
an active layer,
a second conductivity-type semiconductor layer, and
holes connected to the first conductivity-type semiconductor layer through the active layer;
a transparent electrode layer between the first region of the first electrode layer and the light emitting structure, the transparent electrode layer contacting the second conductivity-type semiconductor layer;
an interlayer insulating layer between the transparent electrode layer and the first electrode layer, the interlayer insulating layer including:
first openings respectively connected to the holes of the light emitting structure, and
second openings connected to the transparent electrode layer, each one of the first openings and at least one of the second openings, closest to the one of the first openings, defining one group, such that the first openings correspond to a plurality of groups, respectively;
a second electrode layer between the first electrode layer and the interlayer insulating layer, the second electrode layer being connected to the transparent electrode layer through the second openings, and the second electrode layer being separated from the first electrode layer and extending onto the second region of the first electrode layer;
an electrode pad on the second electrode layer to overlap the second region; and
contact electrodes through the second electrode layer, the interlayer insulating layer, and the transparent electrode layer, the contact electrodes being connected to the first conductivity-type semiconductor layer through the holes,
wherein the plurality of groups includes at least a first group and a second group, the first group being closer to the electrode pad than the second group is, and a first distance between the one of the first openings and the at least one of the second openings in the first group being greater than a second distance between the one of the first openings and the at least one of the second openings in the second group.

2. The semiconductor light emitting device as claimed in claim 1, wherein a width of each of the second openings is less than a width of each of the first openings.

3. The semiconductor light emitting device as claimed in claim 1, wherein the plurality of groups further includes a third group, the third group being on a straight line connecting the first group and the second group.

4. The semiconductor light emitting device as claimed in claim 3, wherein a distance between the first group and the third group is substantially identical to a distance between the second group and the third group.

5. The semiconductor light emitting device as claimed in claim 3, wherein a third distance between the one of the first openings and the at least one of the second openings in the third group is greater than the first distance, and is less than the second distance.

6. The semiconductor light emitting device as claimed in claim 1, wherein:
each one of the first openings and a plurality of the second openings define a single group of the plurality of groups, the plurality of the second openings being around and at a same distance from the one of the first openings within the single group, and
a distance between each one of the first openings and the plurality of the second openings within each of the plurality of groups decreases, as a distance between each of the first openings and the electrode pad increases.

7. The semiconductor light emitting device as claimed in claim 1, further comprising an insulating separation layer between the first electrode layer and the second electrode layer, the contact electrodes passing through the insulating separation layer.

8. The semiconductor light emitting device as claimed in claim 1, wherein the interlayer insulating layer includes at least one of $SiO_2$, SiN, SiON, $TiO_2$, $Si_3N_4$, $Al_2O_3$, TiN, AlN, $ZrO_2$, TiAlN, TiSiN, HfO, $NbO_2$, $TaO_2$, and $MgF_2$.

9. The semiconductor light emitting device as claimed in claim 1, wherein the first electrode layer includes a conductive substrate and a bonding metal layer, the metal bonding layer bonding the conductive substrate to the second electrode layer.

10. The semiconductor light emitting device as claimed in claim 9, wherein the interlayer insulating layer and the second electrode layer define an omnidirectional reflector.

11. The semiconductor light emitting device as claimed in claim 1, wherein the interlayer insulating layer is a multilayer structure having alternately stacked at least one first insulating layer and at least one second insulating layer defining a distributed Bragg reflector, the at least one first insulating layer having a first refractive index, and the at least one second insulating layer having a second refractive index higher than the first refractive index.

12. The semiconductor light emitting device as claimed in claim 1, wherein the transparent electrode layer includes at least one of indium tin oxide, indium zinc oxide, and indium tin zinc oxide.

13. A semiconductor light emitting device, comprising:
a first electrode layer having a first region and a second region;
a light emitting structure on the first electrode layer to overlap the first region, the light emitting structure including:
a first conductivity-type semiconductor layer,
an active layer,
a second conductivity-type semiconductor layer, and
holes connected to the first conductivity-type semiconductor layer through the active layer;
a transparent electrode layer between the first electrode layer and the light emitting structure to overlap the first region, the transparent electrode layer contacting the second conductivity-type semiconductor layer;
an interlayer insulating layer between the transparent electrode layer and the first electrode layer, the interlayer insulating layer having:
first openings respectively connected to the holes, and
second openings connected to the transparent electrode layer, each one of the first openings and at least one of the second openings, closest to the one of the first openings, defining one group, such that the first openings correspond to a plurality of groups, respectively;
a second electrode layer between the first electrode layer and the interlayer insulating layer, the second electrode layer being connected to the transparent electrode layer through the second openings, and the second electrode layer being separated from the first electrode layer and extending onto the second region of the first electrode layer;
at least one electrode pad on the second electrode layer to overlap the second region; and
contact electrodes through the second electrode layer, the interlayer insulating layer, and the transparent electrode layer, the contact electrodes being connected to the first conductivity-type semiconductor layer through the plurality of holes,
wherein the plurality of groups includes at least a first group and a second group, the first group being closer to the at least one electrode pad than the second group is, and a first distance between the one of the first openings and the at least one of the second openings in the first group being greater than a second distance between the one of the first openings and the at least one of the second openings in the second group, and
wherein a number of the second openings in the second group is greater than a number of the second openings in the first group, or a width of the at least one of the second openings in the second group is greater than a width of the at least one of the second openings in the first group.

14. The semiconductor light emitting device as claimed in claim 13, wherein the first openings have a substantially identical width.

15. The semiconductor light emitting device as claimed in claim 13, wherein the at least one electrode pad includes a plurality of electrode pads, the plurality of electrode pads being in a plurality of areas spaced apart from each other, respectively.

16. The semiconductor light emitting device as claimed in claim 13, wherein:
the at least one electrode pad includes a plurality of electrode pads,
the first region has a rectangular shape, and
the second region surrounds the first region, the plurality of electrode pads being adjacent to respective corners of the rectangular shape.

17. A light emitting device package, comprising:
a package substrate having a first lead frame and a second lead frame; and
a semiconductor light emitting device including:
a first electrode layer contacting the first lead frame, the first electrode layer having a first region and a second region,
a light emitting structure overlapping the first region of the first electrode layer, the light emitting structure including a first conductivity-type semiconductor layer, an active layer, and a second conductivity-type semiconductor layer, and having holes connected to the first conductivity-type semiconductor layer through the active layer,
a transparent electrode layer between the first electrode layer and the light emitting structure to overlap the first region, the transparent electrode layer contacting the second conductivity-type semiconductor layer,
an interlayer insulating layer between the transparent electrode layer and the first electrode layer, the interlayer insulating layer having:
first openings respectively connected to the holes, and
second openings connected to the transparent electrode layer, each one of the first openings and at least one of the second openings, closest to the one of the first openings, defining one group, such that the first openings correspond to a plurality of groups, respectively;
a second electrode layer between the first electrode layer and the interlayer insulating layer, the second electrode layer being connected to the transparent electrode layer through the second openings, and the second electrode layer being separated from the first electrode layer and extending onto the second region of the first electrode layer;

an electrode pad electrically connected to the second lead frame, the electrode pad being on the second electrode layer to overlap the second region; and contact electrodes passing through the second electrode layer, the interlayer insulating layer, and the transparent electrode layer, the contact electrodes being connected to the first conductivity-type semiconductor layer through the holes, wherein the plurality of groups includes at least a first group and a second group, the first group being closer to the electrode pad than the second group is, and a first distance between the one of the first openings and the at least one of the second openings in the first group being greater than a second distance between the one of the first openings and the at least one of the second openings in the second group.

18. The light emitting device package as claimed in claim 17, wherein the first lead frame and the electrode pad are connected by a wire.

19. The light emitting device package as claimed in claim 17, wherein a planar area of the first lead frame is greater than a planar area of the second lead frame.

20. The light emitting device package as claimed in claim 17, further comprising a reflective resin layer on the package substrate and surrounding the semiconductor light emitting device, the semiconductor light emitting device further including a wavelength conversion layer on the light emitting structure.

* * * * *